United States Patent
Cheng et al.

(10) Patent No.: US 8,003,455 B2
(45) Date of Patent: Aug. 23, 2011

(54) IMPLANTATION USING A HARDMASK

(75) Inventors: Kangguo Cheng, Guilderland, NY (US);
Bruce B. Doris, Brewster, NY (US);
Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 12/469,710

(22) Filed: May 21, 2009

(65) Prior Publication Data

US 2010/0297837 A1  Nov. 25, 2010

(51) Int. Cl.
*H01L 21/336* (2006.01)
(52) U.S. Cl. .......... 438/199; 438/527; 257/E21.632
(58) Field of Classification Search .......... 438/197–217, 438/527; 257/E21.632
See application file for complete search history.

(56) References Cited

U.S. PATENT DOCUMENTS

| | | | |
|---|---|---|---|
| 4,516,316 A | 5/1985 | Haskell | 29/576 W |
| 5,256,563 A | 10/1993 | Moslehi | 438/283 |
| 5,583,062 A | 12/1996 | Kapoor | 438/283 |
| 5,759,881 A | 6/1998 | Manning | 438/199 |
| 5,770,492 A | 6/1998 | Kapoor | 438/199 |
| 6,025,236 A | 2/2000 | Mathews | 438/297 |
| 6,410,394 B1 * | 6/2002 | Shao et al. | 438/289 |
| 6,506,639 B1 * | 1/2003 | Yu et al. | 438/197 |
| 6,613,626 B1 * | 9/2003 | Hsu | 438/217 |
| 6,989,318 B2 | 1/2006 | Doris | 438/433 |
| 7,297,600 B2 | 11/2007 | Oh | 438/283 |

* cited by examiner

*Primary Examiner* — Brook Kebede
(74) *Attorney, Agent, or Firm* — George Sai-Halasz; Louis J. Percello

(57) ABSTRACT

A method for processing CMOS wells, and performing multiple ion implantations with the use of a single hard mask is disclosed. The method includes forming and patterning a hardmask over a substrate, whereby the hardmask attains a first opening. The substrate may be a semiconductor substrate. The method further includes performing a first ion implantation, during which, outside the first opening the hardmask is essentially preventing ions from reaching the substrate. The method further involves the application of a photoresist in such a manner that the photoresist is covering the hardmask, and it is also filling up the first opening. This is followed by using the photoresist to pattern the hardmask, whereby the hardmask attains a second opening. The method further includes performing a second ion implantation, during which, outside the second opening, the hardmask and the photoresist, which fills the first opening, are essentially preventing ions from reaching the substrate. The two ion implantations may be used to form the two type of CMOS wells.

20 Claims, 6 Drawing Sheets

IMPLANTATION USING A HARDMASK

FIELD OF THE INVENTION

The present invention relates to methods of material processing and electronic circuit fabrication. In particular, it relates to the fabrication of CMOS circuits.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement.

CMOS devices are usually formed in "well"-s: doped regions in a semiconductor substrate. Forming deep wells in a semiconductor substrate require a relative thick resist to prevent dopants from penetrating into other regions of the substrate. As the dimension of wells shrinks along with device scaling, the depth of wells remains almost unchanged from generation to generation. The thick resist that has been conventionally used to block dopant penetration causes several difficulties. First, a resist thick enough to prevent dopant penetration may reduce the lithography process window, or eventually may become incompatible with advanced lithography that is required for patterning small dimension wells. Second, the aspect ratio of the opening in the resist (the ratio between the resist thickness and the minimum dimension of the opening) keeps increasing as the well dimensions shrink. High aspect ratio resist is susceptible to collapse, and thus may cause defects.

SUMMARY OF THE INVENTION

A method is disclosed for processing CMOS wells, and performing multiple ion implantations with the use of a single hard mask. The method includes forming and patterning a hardmask over a substrate, whereby the hardmask attains a first opening. The method further contains performing a first ion implantation during which outside the first opening the hardmask is essentially preventing ions from reaching the substrate. The method further includes the application of a photoresist in a manner that the photoresist is covering the hardmask and it is filling up the first opening. This is followed by using the photoresist to pattern the hardmask, whereby the hardmask attains a second opening. The method further includes performing a second ion implantation, during which outside the second opening the hardmask and the photoresist, which fills the first opening, are essentially preventing ions from reaching the substrate.

BRIEF DESCRIPTION OF THE DRAWINGS

These and other features of the present invention will become apparent from the accompanying detailed description and drawings, wherein.

DETAILED DESCRIPTION OF THE INVENTION

It is understood that FET (Field Effect Transistor) and CMOS (Complementary Metal Oxide Semiconductor) are known in the electronic arts. There are two type of FET devices: a hole conduction type, called PFET, and an electron conduction type, called NFET. Often PFET and NFET devices are combined into CMOS circuits. Other nomenclatures used in the art for such PFET and NFET device combinations are CMOS devices, CMOS device structures, CMOS structures, and others.

The mainstay material of microelectronics is silicon (Si), or more broadly, Si based materials, for instance silicon-germanium (SiGe) alloys. When embodiments of the present invention involve CMOS circuits, the processing is typically within the art of single-crystal Si based material device technology.

CMOS circuits are usually formed in wells—doped regions in a semiconductor substrate. CMOS circuits contain both type of FET devices, consequently, their electrical isolation may require placing the NFET and PFET devices is separate conductivity type wells. An NFET device is fabricated in a p-"well", namely in a p-type conductivity region of the substrate, and conversely, a PFET device is fabricated in an n-"well", namely in an n-type conductivity region of the substrate. The p-wells and n-wells may typically be formed by ion implantation.

Manufacturing of FETs is very well established in the art. It is understood that there are a large number of steps involved in such processing, and each step might have practically endless variations known to those skilled in the art. It is further understood only those process steps will be detailed here that are of interest in embodiments of the present invention.

Figure 1A:
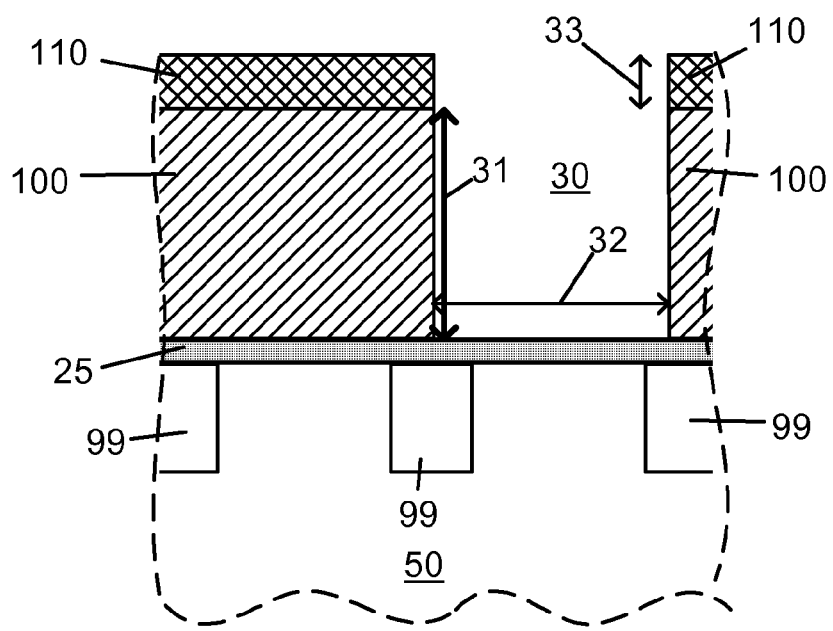
FIG. 1A shows a schematic cross section of a hard mask over a substrate with an opening for implantation.

FIG. 1A shows a schematic cross section of a hard mask over a substrate with an opening for implantation. It illustrates an embodiment for initial stages of the disclosed method involving multiple ion implantations. The figures of the disclosure depict embodiments within the art of CMOS fabrication. However, the disclosed method for multiple ion implantations is not tied to CMOS, or, more broadly, to semiconductor processing. It may be used generally in any field where ion implantation is practiced. For instance, such fields without limitation may include metallurgy, optics, biology, superconductivity, magnetic technologies, and others. Substrate 50, in general, may be any of a large number of materials.

FIG. 1A shows a stage in the ion implantation method for the case of processing a CMOS circuit. In case of CMOS, substrate 50 may be a semiconductor substrate 50, of a Si based, or Ge based, or possibly of a compound semiconductor material, or any suitable combination of those materials, typically of single crystal. In a representative embodiment of the invention the Si based substrate 50 is essentially Si. The substrate may be any type known in the electronic art, such as, without the intent of limitation: bulk, or semiconductor on insulator (SOI), fully depleted, or partially depleted, FIN type, or any other kind. The devices may be isolated from one another by structures known in the art, such as by shallow trenches 99. Such shallow trenches 99 are illustrated in the figures, as they are a typical advanced isolation technique available in the electronics processing art, but their presence is not necessary for embodiments of the present invention.

The figure shows what typically may be only a small fraction of an electronic chip, for instance a processor, as indicated by the wavy dashed line boundaries. The schematic representation of FIG. 1A, as well as of all other figures, implies no real size relationships between the various depicted elements.

FIG. 1A shows a stage of an embodiment where a hardmask 100 has been formed and patterned over the substrate 50. The forming of the hardmask 100 is typically done by some sort of deposition technique in a blanket manner, as it is known in the art. Materials for the hardmask are known in the art, which typically may be an oxide, and/or nitride, such as, without ozone, TEOS (Tetra Ethyl Oxysilane), BSG (Boron-Silicate Glass), SOG (Spin On Glass). The hardmask 100 can be deposited by any conventional deposition method, including but not limited to, atomic layer deposition (ALD), chemical vapor deposition (CVD), low-pressure chemical vapor deposition (LPCVD), plasma enhanced chemical vapor deposition (PECVD), high density plasma deposition (HDP), high temperature oxide deposition (HTO), low temperature oxide deposition (LTO), ozone/TEOS deposition, spin-on-coating, chemical solution deposition, or any combination of those methods.

In the art the term patterning of a layer means, and it is used herein to mean, that in some manner a feature has been defined on the layer, herein the hardmask, and by removing material according to the defined features, the layer acquires a pattern. FIG. 1A illustrates the stage in an embodiment of the method, where due to patterning the hardmask 100 attained a first opening 30. Namely, in the course of patterning, the material of the hardmask over predefined areas has been fully removed. For a CMOS embodiment of the invention, the hardmask is opened up over a first portion of the CMOS circuit. That is, the first opening 30 in the hardmask is defined to be in a first portion of the underlying CMOS circuit.

FIG. 1A shows a photoresist 110 on top of the hardmask 100. This is indicated because in representative embodiments the patterning is done using a photoresist, and the figure shows a stage where the photoresist 110 outside the first opening 30 has not as yet been removed. Depending on demands of various processing details, the photoresist may, or may not, at this stage be fully removed. However, either case is within the scope of the embodiments of the invention. Furthermore, embodiments of the invention include creating a first opening 30 in the hardmask 100, and that does not necessarily involve the use photoresist 110. Any patterning technique leading to the first opening 30 may be suitable for embodiments of the present invention. When photoresist 110 is used, patterns may be first formed in the photoresist layer 110 by lithography technique, followed by an etch step, e.g., reactive ion etch (RIE), to transfer the patterns into the hardmask layer 100. The first opening 30, in general, but particularly in a CMOS processing embodiment, where the first opening is over a first portion of the CMOS circuit, may have almost endless variety of shapes, or configurations. It may be a single opening, or, for instance, for a state of the art CMOS processor, the first opening 30 may contain a large number, typically in the many millions, or billions, of individual apertures. These apertures, which collectively make up the first opening 30, lay over one of the well types, "p" or "n", of the CMOS processor.

Assuming the patterning seen in FIG. 1A is done using photoresist, one may take advantage of the high selectivity of some etching processes between a hardmask 100 and a photoresist 110. A common, oxide reactive ion etch (RIE) process can achieve a 5:1 selectivity. Consequently, the photoresist 110 may be significantly thinner than the hardmask 100, and still the hardmask may be fully removed where needed. A safe range of hardmask thicknesses 31 may be about 1 µm, and the photoresist thickness 33 about 0.3 µm. However, with further downscaling of the technology these thicknesses might shrink, as well. In general, ratios between 4:1 and 3:1 for oxide hardmask to photoresist thickness would be adequate for embodiments of the invention, whatever the absolute values of the layer thicknesses may be. For the photoresist 110 on top of the hardmask 100 it is not a requirement to be thick enough for preventing ion penetration during implantation. The photoresist 110 may be only thick enough for patterning the hardmask 100.

To assure a complete hardmask 100 removal, either during patterning, or when finally the hardmask 100 is not needed and has to be fully removed without damaging the substrate, a thin pad layer 25 may be disposed onto the substrate 50 before forming the hardmask 100. Such a pad layer 25 may comprise nitride, with a thickness of about 10 nm being sufficient. For the case of CMOS embodiments one may precede the disposition of the nitride with a thermal oxidation of the substrate. The pad layer 25, if used at all, may contain other materials than nitride and oxide, either in layered form, or as an admixture.

Figure 1B:
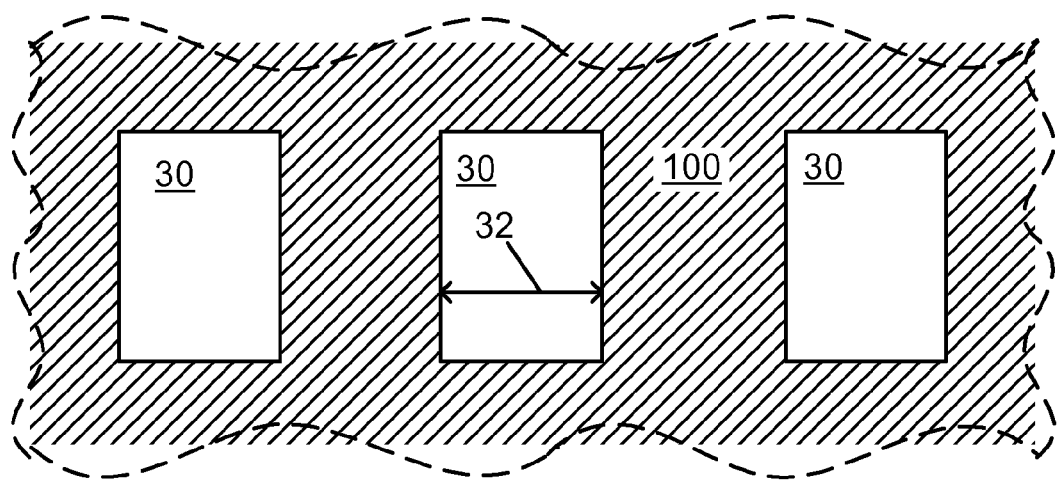
FIG. 1B shows a schematic top view of a hard mask over a substrate with an opening for implantation.

FIG. 1B shows a schematic top view of a hard mask over a substrate with an opening for implantation. The opening 30 may be, and in the case of CMOS well almost always is, a multitude of individual apertures. Whatever the shape of the opening, there may always be found a minimal dimension 32 characteristic of the opening. For instance, if individual apertures are rectangular, as shown, without limitation, in the figures, then the minimal dimension would be the length 32 of the smaller side of the rectangle. The ratio of the hardmask thickness 31 to the opening's minimal dimension 32 is called the "aspect ratio" of the opening. One advantage of using hardmask in for well definition and implantation, may be that a larger aspect ratio can be supported under such conditions by a hardmask 100, than by a photoresist 110. In embodiment of the present invention the aspect ratio of the opening in the hard mask is generally at least 1, and as technology progresses toward smaller dimensions, the aspect ratio may significantly exceed 1, to around 3 to 5.

Figure 2:
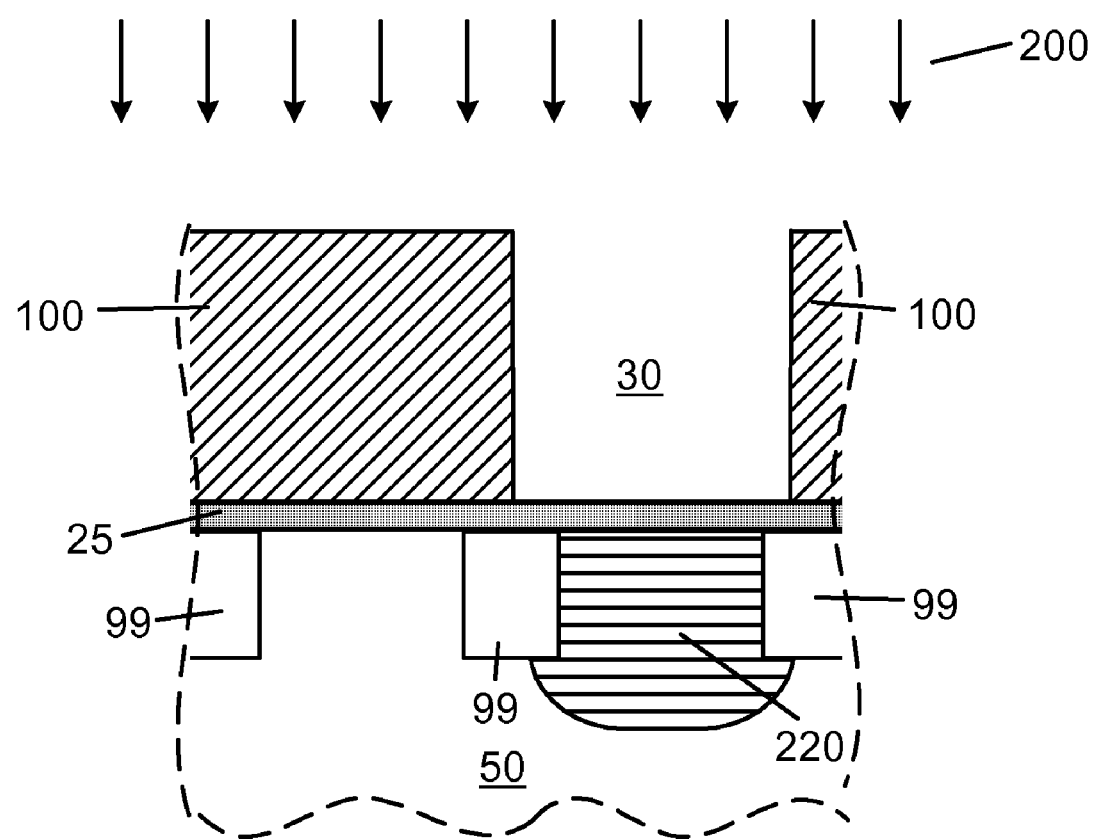
FIG. 2 shows in a schematic cross section a first implantation creating a first implant well in the substrate.

FIG. 2 shows in a schematic cross section a first implantation creating a first implant well in the substrate. At this stage of the method one may perform a first ion implantation 200. Outside the first opening 30 the hardmask 100 is essentially preventing ions from reaching the substrate 50. The hardmask thickness and the implantation energy are chosen in a manner to assure that outside the first opening 30, which for CMOS is the outside of a first portion of the CMOS circuit, the implanted ions are essentially blocked by the hardmask 100. In FIG. 2 no photoresist 110 is shown over the hardmask, but this illustrates only a possible embodiment. In alternate embodiment the photoresist 110 may be left in place over the hardmask during the first ion implantation.

The term "essentially preventing" ions from reaching the substrate 50, is intended to mean that the ions do not reach the substrate 50 under the masked regions in numbers that would have any unwanted effect. As it is known in the art, ion depth penetration during implantation is a statistical process, and there always are "lucky" ions reaching much deeper than the average penetration depth, called implant depth. Generally, masking is not being used to block all ions, which would include "lucky" ones. It is sufficient to prevent unwanted effects. However, if for some reason it would be needed, the hardmask can be made thick enough to block all ions.

As discussed with reference to FIG. 1A, the first opening 30 for CMOS would be over a first portion of the CMOS circuit, which first portion is either the p-well or the n-well portion, or section. In this case the ion implantation 200 comprises a first type of dopant impurities. If a p-well is being fabricated, the first type of dopant impurities may be p-type, such as boron (B), gallium (Ga), indium (In). If an n-well is being fabricated, the first type of dopant impurities may be n-type, such as phosphorus (P), arsenic (As), antimony (Sb). The energy and dose of the implantation are dependent on the species implanted, on the needed depth of the well, and the dopant concentration required. The appropriate ranges for such parameters are known in the art. Such ranges, without limitation, may be, boron: energy 20 keV to 100 keV, dose $5 \times 10^{12}/cm^2$ to $2 \times 10^{12}/cm^2$; arsenic: energy 80 keV to 500 keV, dose: $5 \times 10^{12}/cm^2$ to $2 \times 10^{12}/cm^2$. Typically, the well implants are the highest energy implants during CMOS processing because wells are the deepest doped portions of the FET devices. But, for each case the thickness of the hardmask 100 is selected accordingly to prevent the first type of dopant impurities from reaching the semiconductor substrate 50 outside the first portion of the CMOS circuit, which is the first opening 30. Having finished with the first implantation 200, the appropriate ions of the first well 220 are in place. Also, if at this point photoresist 110 is still present over the hardmask 100, one would strip the photoresist 110 by known processes.

Figure 3:
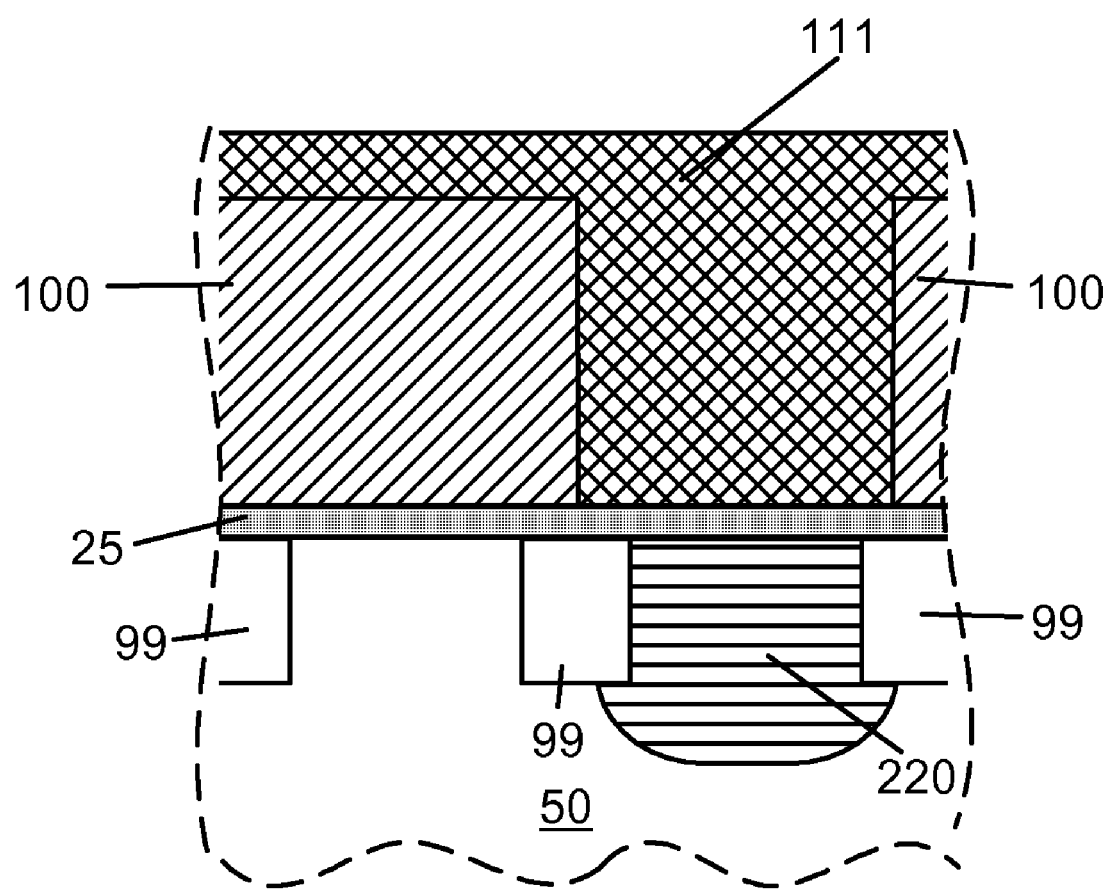
FIG. 3 shows a schematic cross section of a photoresist covering the hardmask and filling the opening.

FIG. 3 shows a schematic cross section of photoresist filling the opening, a step in the direction of multiple ion implantations. Following the stage depicted in FIG. 2, one may apply a photoresist 111, ending up with an essentially even planar surface for the photoresist, which is covering the hardmask 100 and is filling up the first opening 30. For the embodiment dealing with CMOS processing, in this manner the photoresist 111 is masking the first portion of the CMOS circuit. This photoresist 111, which is filling the first opening 30, is not necessarily the same photoresist 110 as used in creating the first opening 30, if a photoresist 110 has been used at all. The two photoresists 110 and 111 may, or may not, be the same depending on the particular needs of a given fabrication. The scope of the invention is not impacted due to choices of various photoresists.

For the thickness of the photoresist 111 over the hardmask 100, the considerations are similar to the ones regarding the earlier application of the photoresist 110: ratios between 4:1 and 3:1 for oxide hardmask to photoresist thickness would be adequate for embodiments of the invention, whatever the absolute values of the layer thicknesses are. Of course, at this stage of the method the photoresist 111 is also filling the first opening 30, at which location, since the photoresist has an essentially even planar surface, the photoresist 111 thickness is increased by a whole hardmask thickness value. For the part of the photoresist 111 which lays on the top of the hardmask 100, it is not a requirement to be thick enough to prevent ion penetration during implantation. The photoresist 111 on the top of the hardmask 100 has to be only thick enough for patterning the hardmask.

Figure 4:
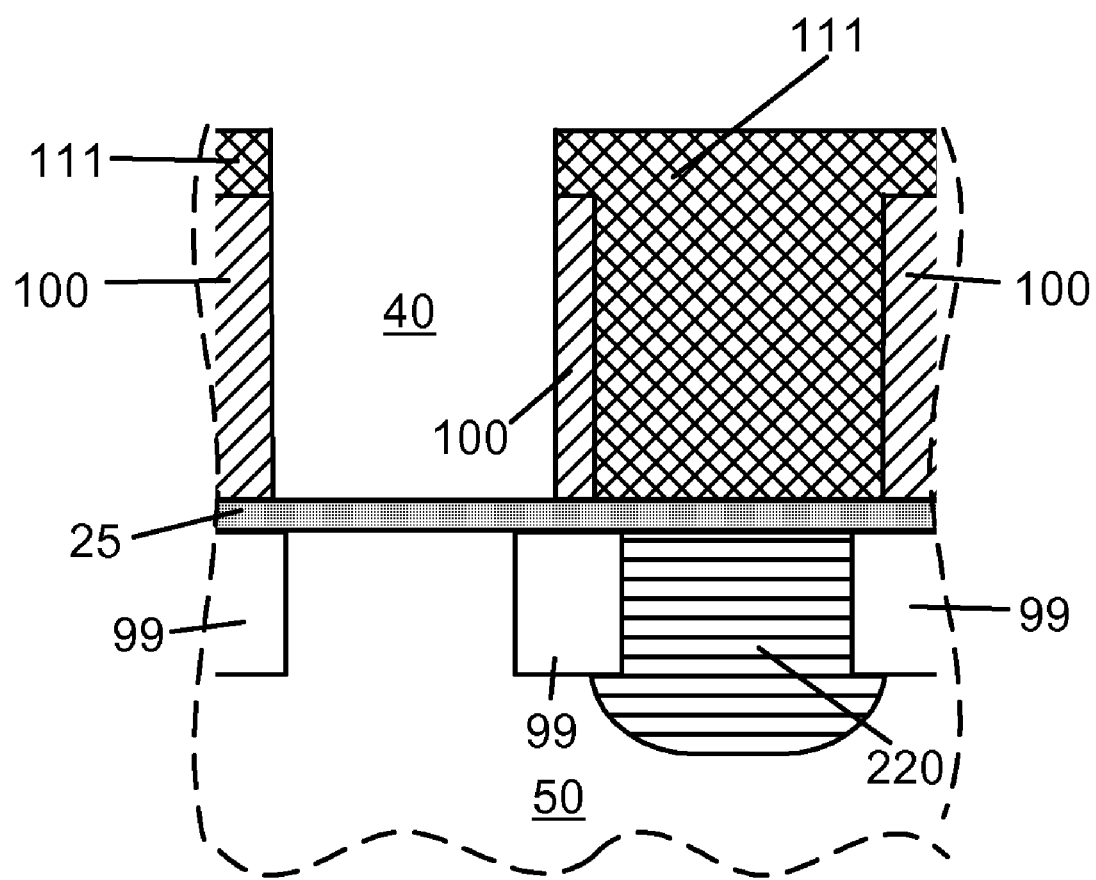
FIG. 4 shows schematic cross section of patterning the hardmask, and creating a second opening for implantation.

FIG. 4 shows in schematic cross section the patterning of the hardmask 100, and creating a second opening 40 for implantation. At this stage of the method the photoresist 111, which also fills the first opening 30, is used for patterning the hardmask 100, consequently the hardmask 100 attains a second opening 40. For a CMOS embodiment of the invention, the hardmask 100 is opened up over a second portion of the CMOS circuit. That is, the second opening 40 in the hardmask is defined to be over a second portion of the underlying CMOS circuit. In the same way as the first opening 30, the second opening 40 may have an almost endless variety of shapes, or configurations. In a CMOS processing embodiment, where the second opening 40 is over a second portion of the CMOS circuit, the second opening 40 may contain a large number, typically in the many millions, or billions, of individual apertures. These apertures, which collectively make up the second opening 40, lay over one of the well types, "p" or "n", of the CMOS processor.

Figure 5:
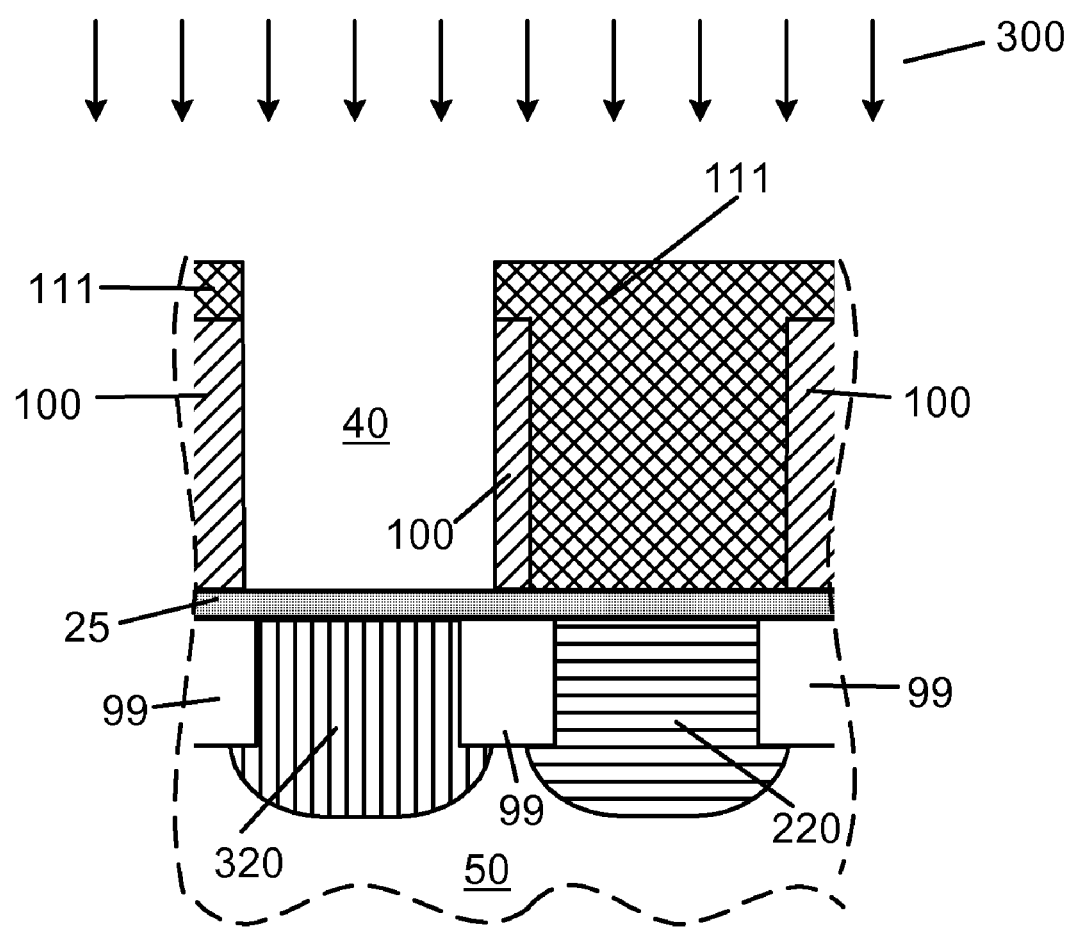
FIG. 5 shows in a schematic cross section a second implantation creating a second implant well in the substrate.

FIG. 5 shows in a schematic cross section a second implantation creating a second implant well in the substrate. At this stage of the method one may perform a second ion implantation 300. As FIG. 5 indicates, the photoresist 111 is left in place during the ion implantation 300, since this photoresist 111, apart of its use in patterning, in the first opening 30 it is an ion blocker. Although, if needed, one may thin the photoresist 111 to a desired degree without removing it completely from the first opening 30. Outside the second opening 40 the hardmask 100, and the photoresist 111 filling the first opening 30, are essentially preventing ions from reaching the substrate 50. Again, the hardmask thickness and the implantation energy were chosen in a manner to assure that outside the second opening 40, the implanted ions are essentially blocked. For CMOS, embodiments performing the second ion implantation comprise the implanting of second type of dopant impurities. Outside of the second portion of the CMOS circuit, the hardmask 100 and the photoresist 111 are essentially preventing the second type of dopant impurities from reaching the semiconductor substrate 50.

The second ion implantation considerations for CMOS are essentially the same as for the first ion implantation, discussed in relation to FIG. 2. In brief, the second opening 40 for CMOS would be either the p-well or the n-well portion, or section. If a p-well is being fabricated, the second type of dopant impurities may be p-type. If an n-well is being fabricated, the second type of dopant impurities may be n-type. The energy and dose considerations are the same as for the first ion implantation, and are known in the art.

Having finished with the second implantation 300, the appropriate ions of the second well 320 are in place. Embodiments of the invention thus show that one is capable of doing multiple implantations in succession with only a single hardmask. The photoresist, which at each successive stage is used to newly pattern the hardmask, automatically fills up the preexisting openings of previous implantations. The photoresist itself acts as a mask in these preexisted openings.

If the needed multiple ion implantations are over 2, the method may be extended to until a predetermined, greater than 2, number of ion implantations have been performed. One would be repeating the steps of: applying an additional photoresist; patterning the hardmask, thereby creating an additional opening; performing an additional ion implantation. Outside the additional opening the hardmask and the additional photoresist would essentially prevent ions from reaching the substrate 50. Consequently, a single hardmask is sufficient to perform several, at least up to 20, successive, patterned ion implantations.

Figure 6:
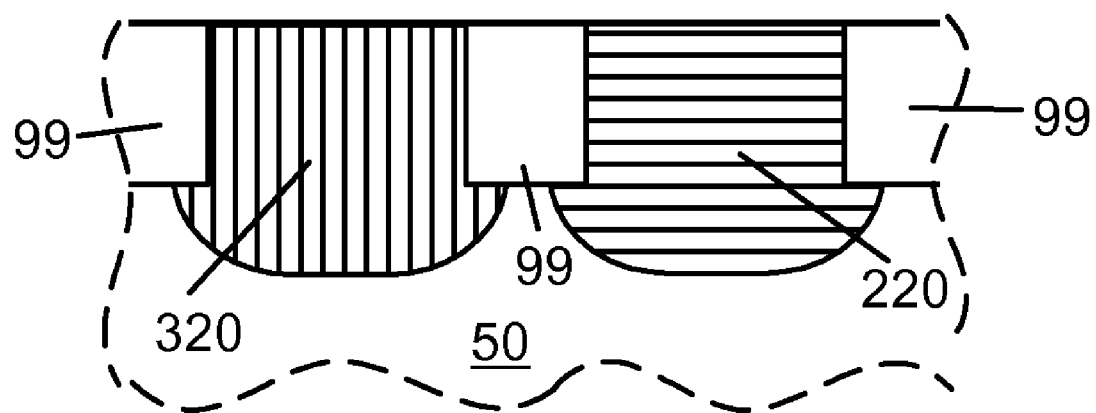
FIG. 6 shows a schematic cross section of a processed structure with the layers that covered the substrate removed.

FIG. 6 shows a schematic cross section of a processed structure, with the layers covering the substrate removed. Having completed the implantations one may now strip the unwanted layers. One would remove all the photoresist 111, then the hardmask 100, and, if used, the pad layer 25. Techniques for removing these layers is well know in the art. The result is a substrate with the two types of wells 220 and 320 in place and ready for further processing of the CMOS circuit.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under", "over", "top", "on", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

We claim:

1. A method for multiple ion implantations, comprising:
   forming and patterning a hardmask over a substrate, wherein said hardmask attains a first opening;
   performing a first ion implantation, wherein outside said first opening said hardmask is essentially preventing ions from reaching said substrate;
   ensuing said first ion implantation, applying a photoresist, wherein said photoresist is covering said hardmask and is filling said first opening;
   using said photoresist to pattern said hardmask, wherein said hardmask attains a second opening; and
   performing a second ion implantation, wherein outside said second opening said hardmask and said photoresist are essentially preventing ions from reaching said substrate.

2. The method of claim 1, wherein said method further comprises selecting a semiconductor substrate as said substrate.

3. The method of claim 2, wherein said method further comprises selecting ions of said first ion implantation to comprise first type dopant impurities, and selecting ions of said second ion implantation to comprise second type dopant impurities.

4. The method of claim 3, wherein said first opening defines a first well of a CMOS circuit, and said second opening defines a second well of said CMOS circuit.

5. The method of claim 4, wherein said method further comprises selecting said first type dopant impurities as n-type, selecting said second type dopant impurities as p-type, wherein said first well is an n-well, and said second well is a p-well.

6. The method of claim 4, wherein said method further comprises selecting said first type dopant impurities as p-type, selecting said second type dopant impurities as n-type, wherein said first well is a p-well, and said second well is an n-well.

7. The method of claim 1, wherein said method further comprises disposing a pad layer onto said substrate before forming said hardmask.

8. The method of claim 1, further comprising:
   until a predetermined number of ion implantations have been performed, repeating the steps of:
   applying an additional photoresist;
   using said additional photoresist, patterning said hardmask, wherein creating an additional opening;
   performing an additional ion implantation;
   wherein outside said additional opening said hardmask and said additional photoresist are essentially preventing ions from reaching said substrate.

9. A method for processing a CMOS circuit, comprising:
   forming and patterning a hardmask over a semiconductor substrate, wherein said hardmask is opened up in a first portion of said CMOS circuit;
   performing a first ion implantation comprising first type of dopant impurities, wherein outside said first portion said hardmask is essentially preventing said first type of dopant impurities from reaching said semiconductor substrate;
   ensuing said first ion implantation, applying a photoresist, wherein said photoresist is covering said hardmask and is masking said first portion;
   using said photoresist to pattern said hardmask, wherein said hardmask is opened up in a second portion of said CMOS circuit;
   performing a second ion implantation comprising second type of dopant impurities, wherein outside said second portion said hardmask and said photoresist are essentially preventing said second type of dopant impurities from reaching said semiconductor substrate;
   selecting said first and second portions to be wells for said CMOS circuit.

10. The method of claim 9, wherein said method further comprises selecting said first type dopant impurities as n-type, and selecting said second type dopant impurities as p-type.

11. The method of claim 9, wherein said method further comprises selecting said first type dopant impurities as p-type, and selecting said second type dopant impurities as n-type.

12. The method of claim 9, wherein said hardmask is chosen to comprise an oxide.

13. The method of claim 12, wherein said method further comprises disposing a pad layer onto said semiconductor substrate before forming said hardmask.

14. The method of claim 13, wherein said pad layer is chosen to comprise nitride.

15. The method of claim 9, wherein said hardmask is chosen to comprise nitride.

16. A method for fabricating a CMOS circuit, comprising:
   forming a hardmask over a semiconductor substrate, wherein said hardmask has a thickness;
   patterning an opening in said hardmask, and selecting said opening to define a well for said CMOS circuit, wherein said opening has a minimal lateral dimension, and selecting the ratio of said thickness to said minimal lateral dimension to be greater than 1; and
   implanting dopant impurities, wherein outside said opening said hardmask is essentially preventing said dopant impurities from reaching said substrate.

17. The method of claim 16, wherein said hardmask is chosen to comprise an oxide.

18. The method of claim 17, wherein said method further comprises disposing a nitride pad layer onto said semiconductor substrate before forming said hardmask.

19. The method of claim 16, wherein said method further comprises selecting said dopant impurities as n-type.

20. The method of claim 16, wherein said method further comprises selecting said dopant impurities as p-type.

* * * * *